United States Patent [19]

Moore

[11] 4,110,665
[45] Aug. 29, 1978

[54] CONTROL CIRCUIT FOR BAR GRAPH DISPLAY PANEL

[75] Inventor: James O. Moore, Worcester Township, Montgomery County, Pa.

[73] Assignee: Moore Products Co., Spring House, Pa.

[21] Appl. No.: 815,101

[22] Filed: Jul. 13, 1977

[51] Int. Cl.² .................... H05B 37/00; H05B 39/00; H05B 41/00
[52] U.S. Cl. ........................ 315/169 TV; 340/324 M
[58] Field of Search .................. 340/166 EL, 324 M; 315/169 R, 169 TV; 313/520

[56] References Cited
U.S. PATENT DOCUMENTS

| | | | |
|---|---|---|---|
| 3,967,158 | 6/1976 | Saxon | 315/169 TV |
| 4,009,414 | 2/1977 | Bockett-Pugh | 315/169 R |

*Primary Examiner*—Alfred E. Smith
*Assistant Examiner*—Robert E. Wise
*Attorney, Agent, or Firm*—Zachary T. Wobensmith, 2nd; Zachary T. Wobensmith, III

[57] ABSTRACT

A control circuit for bar graph display panels is described which reduces the tendency to drift, which obviates the necessity of maintaining an absolutely constant oscillator frequency and an absolutely constant ramp rate by utilizing a feedback system to reference the ramp end points to a single precise voltage.

8 Claims, 2 Drawing Figures

CONTROL CIRCUIT FOR BAR GRAPH DISPLAY PANEL

BACKGROUND OF THE INVENTION

1. Field of the Invention

This invention relates to a control circuit for bar graph display panels.

2. Description of the Prior Art

It has heretofore been proposed to provide bar graph display panels that provide analog displays with digital accuracy, these being useful for process control and other purposes. The display panels had low cost drive circuitry and low power consumption.

The bar graph panels are constructed of a rear substrate, spacer and glass front plate with a desired segment pattern screened onto the substrate using a conductive ink, a black dielectric mask screened onto the substrate. The front glass has two transparent anodes applied for dual linear bar graph displays. The interior space is sealed and filled with a neon gas mixture. Panel connections are made through a connector assembly between the glass and the substrate and which mates with printed contacts on one end of the panel. Structures of this type are available from Burroughs Corporation, Electronic Components Division, Plainfield, New Jersey, and such a panel is shown in U.S. Patent to Maloney, No. 3,973,166 and controls for such a panel are shown in Saxon, U.S. Pat. No. 3,967,158.

The drive circuits for the bar graph display panels heretofore available had various shortcomings, including the tendency to drift, which are overcome with the control circuitry of the present invention.

SUMMARY OF THE INVENTION

In accordance with the present invention a control circuit is provided for bar graph display panels which reduces the tendency to drift, which obviates the necessity of maintaining a constant oscillator frequency within a very narrow range and a constant ramp rate within a very narrow range by utilizing a feedback system to reference the ramp end points to a single precise voltage.

It is the principal object of the invention to provide circuitry for bar graph display panels in which the starting voltage of the ramp and the peak voltage of the ramp are related to a single constant voltage.

It is a further object of the invention to provide circuitry for bar graph display panels which is independent of the frequency of the oscillator forming part of the circuitry.

It is a further object of the invention to provide circuitry for bar graph display panels which will have a greater order of reliability and accuracy of response than has heretofore been available.

Other objects and advantageous features of the invention will be apparent from the description and claims.

BRIEF DESCRIPTION OF THE DRAWINGS

The nature and characteristic features of the invention will be more readily understood from the following description taken in connection with the accompanying drawings forming part hereof in which.

It should, of course, be understood that the description and drawings herein are illustrative merely and that various modifications and changes can be made in the structure disclosed without departing from the spirit of the invention.

DESCRIPTION OF A PREFERRED EMBODIMENT

Figure 1:
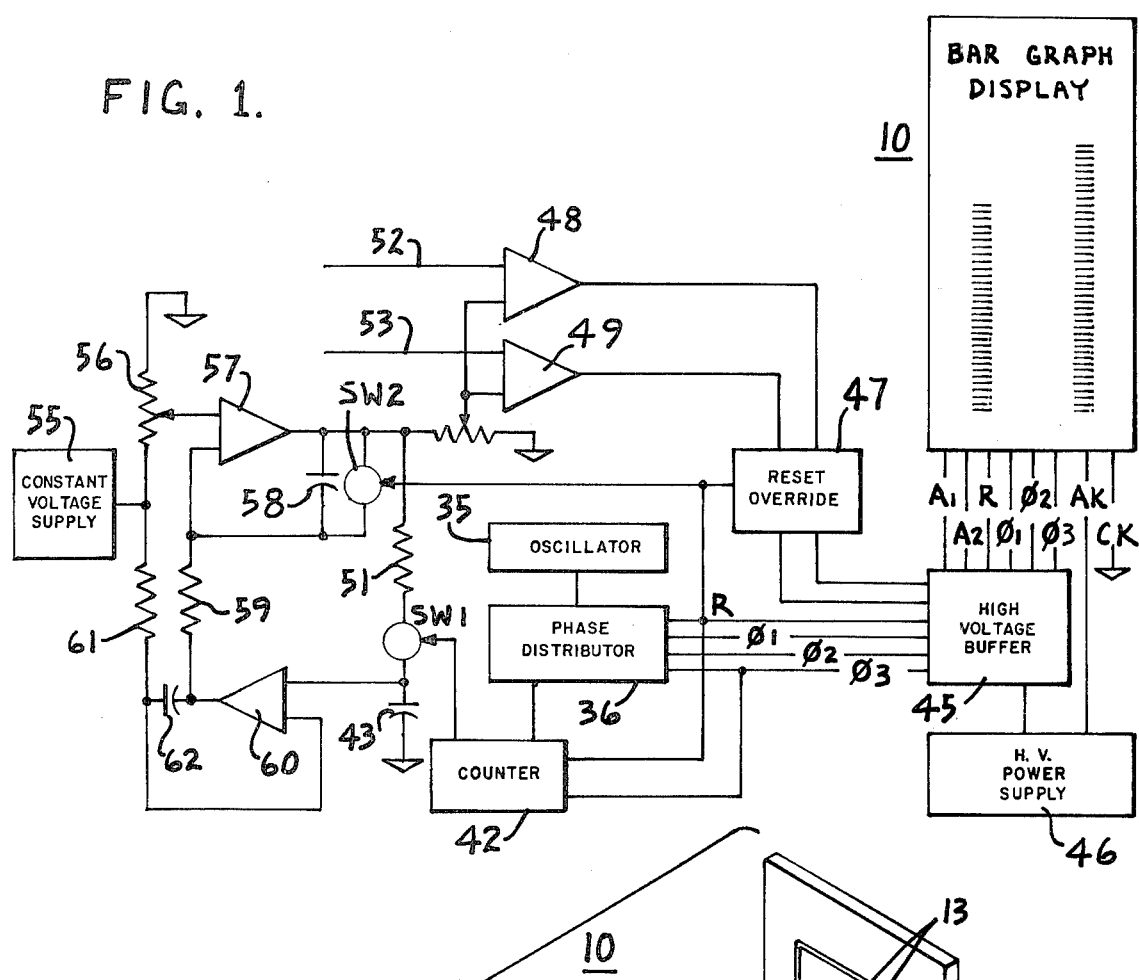
FIG. 1 is a diagrammatic view of the circuitry for bar graph display panels in accordance with the invention.
Figure 2:
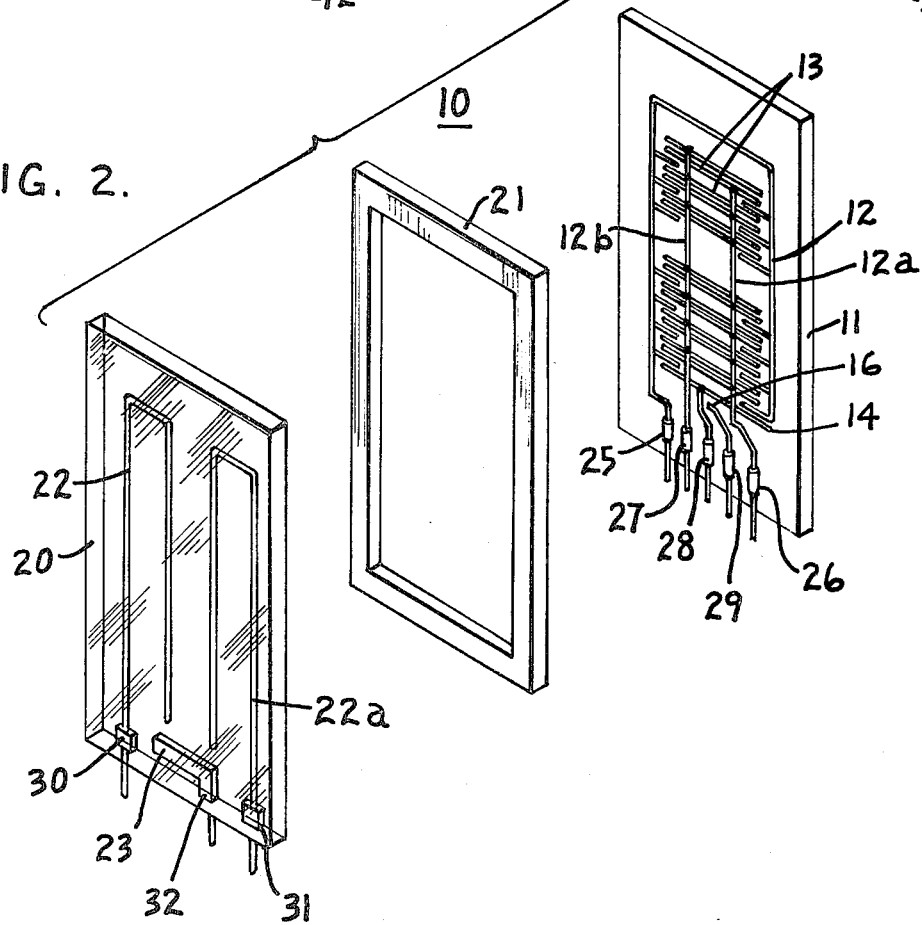
FIG. 2 is an exploded perspective view of a typical bar graph display panel.

Referring now more particularly to the drawings and specifically to FIG. 2, a bar graph display panel 10 is shown which includes a rear rectangular substrate 11, preferably on non-electrical conductive glass or synthetic plastic, having the desired pattern screened onto the substrate 11 with an electrically conductive ink, and including internal three phase bussing 12, 12a, and 12b, screened cathode segments 13, a reset cathode segment 14 and a keep-alive cathode 16.

A black dielectric mask (not shown) may be screened onto the substrate 11 to create a light absorbent background to enhance the contrast ratio. A front rectangular glass plate 20 is provided, spaced from the substrate 11 by a rectangular spacer frame 21. The spacer 21 is sealed to the substrate 11 and to the plate 20 in gas tight relation.

The front plate 20 has two transparent anodes 22 and 22a, and a keep-alive anode 23 applied thereto. The two anodes 22 and 22a are employed for the display of two bar graphs at the front of panel 20.

The interior space within the display panel 10 is filled with an ionizable gas, such as 99.8% neon with 0.2% xenon, under pressure.

Contact terminals 25, 26, and 27 are provided for the bussing lines 12, 12a and 12b, contact terminal 28 is provided for the reset cathode segment 14 and contact terminal 29 is provided for the cathode 16 and is connected to ground.

Contact terminals 30 and 31 are provided for the anodes 22 and 22a and contact terminal 32 is provided for the keep-alive anode 23.

An oscillator 35 is provided to supply clock voltage pulses to a phase distributor 36. The phase distributor 36 delivers a reset pulse and phase pulses to high voltage buffer 45. The phase distributor 36 can be of any desired type one suitable structure being a dual JK flip-flop connected so that both units are on only during the reset pulse from a counter 42, and thereafter for successive clock pulses from the oscillator 35, the dual flip-flops successively take the conditions of one on and the other off, one off and the other on, and both off. The outputs of the dual flip-flops may be connected to four 2-input nor gates which respond to the above conditions by delivering the reset and phase pulses to the desired terminals.

The counter 42 initiates a reset pulse when the phase pulses equal the required number to reach the top of the bar graph display. The counter 42 may include a binary counter which is advanced only by the phase 3 pulse and accordingly advances one digit for each three clock pulses. The output of the binary counter may be connected to three 3-input nand gates which respond to the output levels from the binary counter by delivering the pulse preceeding the reset pulse to the ramp control switch SW1 establishing a connection to the capacitor 43 during the pulse to charge it to equal the peak ramp voltage value.

On the next clock pulse the counter 42 supplies the reset pulse to the distributor 36, which in turn distributes the reset pulse to the counter 42 for resetting the binary counter to zero, to a reset override 47 for insuring that both anodes 22 and 22a are energized during the reset pulse and to the switch SW2 for discharging capacitor 58 thereby initiating a new ramp cycle and as previously mentioned, to the high voltage buffer 45 for activating the reset cathode segment 14 during this pulse.

The high voltage buffer 45 converts low voltage logic signals, of the order of 15 volts, to high voltages of the order of 250 volts required by the bar graph display 10. The high voltage is supplied from a high voltage power supply 46 which is supplied from an external source and can be regulated by a zener diode/resistance network. The voltage pulses may be controlled by a type UHP-481 seven element driver such as manufactured by Sprague Electric Company, North Adams, Mass.

Signal inputs 52 and 53 are connected to the operational amplifiers 48 and 49.

A constant voltage supply 55, such as a zener diode, is provided with an adjustment to establish the value corresponding to the minimum ramp voltage by an adjustable resistor network 56.

The ramp is generated by an operational amplifier 57 which is connected for input to the amplifiers 48 and 49, through a variable resistor 54.

A negative feedback capacitor 58 is provided which is charged by the current flowing in resistor 59 to produce the ramp.

The ramp is terminated by the reset pulse as previously described.

The current in resistor 59 is controlled by an operational amplifier 60 which compares the constant voltage source 55 and the voltage stored in capacitor 43. The voltage in capacitor 43 is supplied through resistor 51 during the pulse preceding the reset pulse and thus equals the peak ramp voltage. Any deviation between the peak voltage from the source 55 will change the charging current in the resistor 59 to restore equality. The resistor 61 and capacitor 62 are selected to provide stable response of the control circuit which includes the operational amplifier 60 so that there is no objectionable hunting or overshooting in controlling the peak ramp voltage. It will be noted that the starting voltage of the ramp and the peak voltage of the ramp are related by this circuitry to the single constant voltage source and are independent of the frequency of the oscillator 35 and the exact values of the capacitor 58 and resistor 59.

It will be noted that in the operation of the bar graph 10 the visible glow climbs up the scale at a rate determined by the oscillator frequency and that the upward trend is terminated when the ramp voltage equals the input voltage since at that point the output of the amplifier 48 or of the amplifier 49 will be zero, cutting off the glow at the corresponding anode. The action is repeated many times per second so that the appearance is that of a solid bar extending up to the cut-off point.

The synchronization of the ramp voltage rise with the oscillator frequency governs the rate at which the bar is established.

The use of the feedback system heretofore described which references the ramp end points to a single precision voltage reference obviates the necessity for maintaining an obsolutely constant oscillator frequency and an absolutely constant ramp rate.

I claim:

1. An electronic circuit for controlling a bar graph display comprising
    generating means for producing a ramp voltage that increases at a constant rate,
    restoring means for periodically terminating said voltage increase and reducing said voltage to a predetermined initial value,
    timing means for controlling the period of said reducing action, and
    control means responsive to the peak value of said voltage for adjusting said rate to maintain said peak value at a predetermined magnitude.

2. A circuit as defined in claim 1 wherein
    said timing means includes an oscillator for generating timing pulses,
    logic means for distributing said pulses sequentially to a plurality of circuits,
    said means including members for delivery of one of said pulses to a first different circuit after a predetermined number of said sequentially distributed pulses and delivery of the next pulse to control said restoring means.

3. A circuit as defined in claim 1 wherein
    said timing means includes an oscillator for generating timing pulses,
    logic means for distributing said pulses sequentially to a plurality of circuits and after a predetermined number of said sequentially distributed pulses for delivery of one of said pulses to a first different circuit for connecting said ramp voltage to said control means and for delivery of a subsequent pulse to a second different circuit for activating said restoring means.

4. A circuit as defined in claim 1 wherein
    said control means comprises an operational amplifier whose two input terminals are connected respectively to a source of controlled constant voltage and to a capacitor which is charged to the peak value of said ramp voltage.

5. A circuit as defined in claim 2 wherein
    said control means comprises an operational amplifier whose two input terminals are connected respectively to a source of controlled constant voltage and to a capacitor and said first different circuit has members for connecting said ramp voltage to said capacitor during said one pulse.

6. A circuit as defined in claim 1 wherein
    said generating means comprises an operational amplifier whose positive input terminal is connected to a source of controlled constant voltage and whose output is connected through a capacitor in its negative input terminal.

7. A circuit as defined in claim 6 wherein
    said control means comprises a second operational amplifier whose two input terminals are connected respectively to a source of controlled constant voltage and to a capacitor which is charged to the peak value of said ramp voltage,
    the output of last said operational amplifier being connected through a resistor to said negative input terminal of first said operational amplifier for controlling the charging rate of the capacitor connected thereto.

8. A circuit as defined in claim 7 wherein
    first said controlled constant voltage is derived from second said controlled constant voltage by an adjustable resistor network.

* * * * *